US006541870B1

(12) United States Patent
Huang et al.

(10) Patent No.: US 6,541,870 B1
(45) Date of Patent: Apr. 1, 2003

(54) SEMICONDUCTOR PACKAGE WITH STACKED CHIPS

(75) Inventors: Chien-Ping Huang, Taichung (TW); Tzong-Da Ho, Taichung (TW); cheng-Hsu Hsiao, Nantou (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/990,788

(22) Filed: Nov. 14, 2001

(51) Int. Cl.[7] .......................... H01L 23/48; H01L 23/52; H01L 29/40

(52) U.S. Cl. ........................................ 257/777; 438/108

(58) Field of Search .......................... 438/106; 257/777, 257/778, 678

(56) References Cited

U.S. PATENT DOCUMENTS 5,741,542 A 4/1998 Williams et al. ......... 427/208.4
5,977,640 A * 11/1999 Bertin et al. ................ 257/777
6,215,193 B1 4/2001 Tao et al. ................... 257/777
6,365,966 B1 * 4/2002 Chen et al. ................. 257/723

FOREIGN PATENT DOCUMENTS

JP 11354714 A * 12/1999

* cited by examiner

*Primary Examiner*—Wael Fahmy
*Assistant Examiner*—Dana Farahani
(74) *Attorney, Agent, or Firm*—Peter F. Corless; Steven M. Jensen; Edwards & Angell, LLP

(57) ABSTRACT

A semiconductor package with stacked chips is proposed, wherein at least two chips are stacked on a chip carrier in a stagger manner as to dispose a second chip on a first chip, and a supporting element is disposed on the second chip and dimensioned to cover area on the second chip with no support from the first chip. The supporting element provides support to the second chip, allowing bonding wires to be successfully connected to the second chip, without the occurrence of cracks of the second chip. The supporting element can be formed on its lower surface with protruding portions positioned outside edge sides of the second chip; this is to enhance structural strength of the supporting element, and help maintain the second chip intact in structure during wire bonding. The supporting element can further have its upper surface to be exposed to the atmosphere; this improves heat dissipating efficiency of the semiconductor package.

17 Claims, 3 Drawing Sheets

SEMICONDUCTOR PACKAGE WITH STACKED CHIPS

FIELD OF THE INVENTION

The present invention relates to semiconductor packages, and more particularly, to a semiconductor package having at least two stacked chips.

BACKGROUND OF THE INVENTION

In order to enhance functionality and performance of electronic devices, a semiconductor package incorporated with multiple semiconductor chips is desirably created In exemplification of a semiconductor package accommodated with two stacked chips, the two chips are stacked in a stagger manner that bond pads on a lower chip and bonding wires connected thereto are not interfered by an upper chip disposed on the lower chip. However, in such a chip arrangement, the upper chip is partly in contact with the lower chip, thereby making other part of the upper chip suspended with no support from the lower chip. Therefore, in a wire bonding process, the suspended part of the upper chip tends to crack, and thus wire bonding quality is detrimentally affected.

Accordingly, U.S. Pat. Nos. 5,721,542 and 6,215,193 disclose a semiconductor package 1 with supporting structure made as pillars. As shown in FIGS. 7 and 8, the semiconductor package 1 includes a chip carrier 10 mounted with a first chip 11 and a second chip 12, wherein the second chip 12 is stacked on the first chip 11 in a perpendicular stagger manner. A plurality of pillars 13 are interposed between the chip carrier 10 and the second chip 12. A plurality of bonding wires 14, 15 are used to electrically connect the chips 11, 12 respectively to the chip carrier 10. And an encapsulant 16 is formed to encapsulate the chips 11, 12 and the pillars 13. Such a semiconductor package 1 is therefore characterized in the use of the pillars 13 for providing support to the second chip 12; this is to help eliminate the foregoing chip cracking problem in a wire bonding process, and thereby maintain the second chip 12 intact in structure during connecting the bonding wires 15 to the second chip 12. However, there are several drawbacks in fabrication and practical use of forming the pillars 13 as supporting structure, as described in the following.

First, in the case of forming two pillars 13, after mounting the first chip 11 on the chip carrier 10 by an adhesive (not shown), one of the pillars 13 and then the other pillar 13 are in turn adhered onto the chip carrier 10 by the adhesive. In such a three-step attachment process, a usage amount and thickness of the adhesive are hardly controlled, thereby easily resulting in bad coplanarity between top surfaces of the first chip 11 and the pillars 13. As such, the second chip 12 disposed on the first chip 11 and the pillars 13 cannot be firmly supported with its planarity being degraded. Such a chip 12 then may be bonded with the bonding wires 15, while the wire bonding quality is undesirably deteriorated. Moreover, due to the pillars 13 positioned beneath the second chip 12, during forming the encapsulant 16, mold flow of an encapsulating compound easily generates turbulence within a narrow gap between the second chip 12 and the chip carrier 10, thereby resulting in the occurrence of voids and also possibly popcorn effect, which therefore seriously affect product quality. In addition, as mentioned above, the pillars 13 are formed on the chip carrier 10 by the multi-step attachment process; this accordingly increases complexity and costs in fabrication. Therefore, how to provide sufficient support to a chip and assure intactness of chip structure and wire bonding quality, is a critical topic to deliberate.

SUMMARY OF THE INVENTION

A primary objective of the present invention is to provide a semiconductor package with stacked chips, in which chip planarity and wire bonding quality are assured.

Another objective of the invention is to provide a semiconductor package with stacked chips, in which the occurrence of voids is eliminated in mold flow of an encapsulating compound.

Still another objective of the invention is to provide a semiconductor package with stacked chips, in which complexity and costs in fabrication are reduced.

A further objective of the invention is to provide a semiconductor package with stacked chips, in which heat dissipating efficiency is improved.

In according with the foregoing and other objectives, the present invention proposes a semiconductor package with stacked chips, comprising: a chip carrier; at least one first chip having an active surface and an opposing non-active surface, wherein the active surface are formed with a plurality of bond pads thereon, and the non-active surface is attached to the chip carrier; at least one second chip having an active surface and an opposing non-active surface, wherein the active surface are formed with a plurality of bond pads thereon, and the non-active surface is partly attached to the active surface of the first chip in a stagger manner that the bond pads on the first chip are not covered by the second chip; a supporting element having an upper surface and an opposing lower surface, wherein the lower surface is attached to the active surface of the second chip in a manner as not to interfere with arrangement of the bond pads on the second chip, and the supporting element is dimensionally sufficient in surface area to cover part of the second chip where no support is provided by the first chip; a plurality of first bonding wires for electrically connecting the bond pads on the first chip to the chip carrier; a plurality of second bonding wires for electrically connecting the bond pads on the second chip to the chip carrier; and an encapsulant for encapsulating the first and second chips, the supporting element, and the first and second bonding wires.

In the semiconductor package with stacked chips of the invention, since the supporting element is dimensionally sufficient in surface area to cover part of the second chip where no support is provided by the first chip, this therefore enhances bending moment of the second chip. As such, in a wire bonding process for connecting the second bonding wires to the second chip, enhance bending moment of the second chip is capable of maintaining intactness in chip structure without the occurrence of cracks of the second chip, and thus the wire bonding quality can be assured. Moreover, unlike supporting structure of pillars used in the prior art, the supporting element of the invention does not interfere with mold flow of an encapsulating compound used for forming the encapsulant, and thus no turbulence or void occurs in the mold flow, thereby not leading to popcorn effect that may cause serious damage in structure. Furthermore, the deposition of the supporting element on the second chip does not undesirably affect the chip planarity; therefore, a drawback in the prior art of unstable disposition of a second chip due to bad coplanarity between pillars and a first chip can be eliminated. In addition, the supporting element can be formed as a plate that is made of a thermally conductive material such as copper or copper alloy, which therefore can be cost-effectively fabricated by using simple processes.

The supporting element of the invention can be formed on its lower surface with at least one protruding portion, which is positioned outside edge sides of the second chip and does not interfere with the connection between the bond pads on the second chip and the second bonding wires. The protruding portion is used to increase structural strength of the supporting element, thereby making the bending moment of the second chip further enhanced, so as to firmly assure the wire bonding quality and structural intactness for the second chip.

The supporting element can further be made with increase in thickness in a manner that, its upper surface is higher in elevation than wire loop tops of the second bonding wires and exposed to outside of the encapsulant. The supporting element with increased thickness can therefore further enhance the bending moment of the second chip, so as to effectively prevent chip cracking from occurrence. Since the supporting element is made of a thermally conductive material, the exposed upper surface thereof therefore helps improve heat dissipating efficiency of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1:
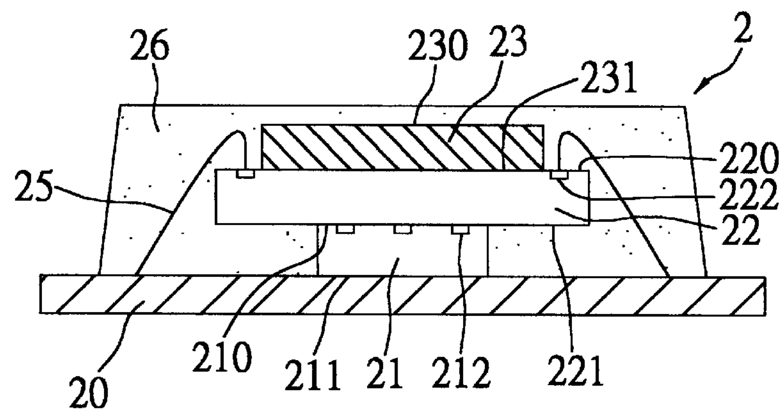
FIG. 1 is a sectional view of a first preferred embodiment of a semiconductor package of the invention.
Figure 2:
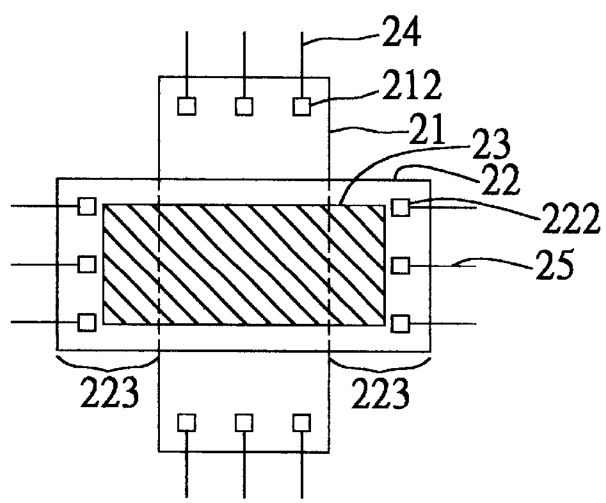
FIG. 2 is a top view showing arrangement of stacked chips and a supporting element of FIG. 1.

Illustrated in FIGS. 1 and 2 are a semiconductor package 2 of a first preferred embodiment of the invention. As shown in the drawing, the semiconductor package 2 comprises: a chip carrier 20; at least one first chip 21 mounted on the chip carrier 20; at least one second chip 22 stacked on the first chip 21; a supporting element 23 disposed on the second chip 22, for providing support to the second chip 22 in a wire bonding process; a plurality of first bonding wires 24 for electrically connecting the first chip 21 to the chip carrier 20; a plurality of second bonding wires 25 for electrically connecting the second chip 22 to the chip carrier 20; and an encapsulant 26 for encapsulating the chips 21, 22, the supporting element 23 and the bonding wires 24, 25.

Since the chip carrier 20 is fabricated by using conventional materials and technology, thus it is not further described herein. The first chip 21 has an active surface 210 and an opposing non-active surface 211, wherein the active surface 210 is formed with a plurality of bond pads 212 thereon to be connected with the first bonding wires 24, and the non-active surface 211 is adhered to the chip carrier 20 by means of a conventional adhesive (not shown). The second chip 22 has an active surface 220 and an opposing non-active surface 221, wherein a plurality of bond pads 222 are formed on the active surface 220 to be connected with the second bonding wires 25, and the non-active surface 221 is partly attached to the active surface 210 of the first chip 21 in a stagger manner as not to interfere with the arrangement of the bond pads 212 on the first chip 21. As shown in FIG. 2, the first chip 21 and the second chip 22 are stacked in a perpendicular stagger manner. However, such a chip arrangement is illustrated only for the sake of exemplification; it should be noted that any chip stack arrangement with the bond pads 212 on the first chip 21 not being covered by the second chip 22 is encompassed in the scope of the invention.

The supporting element 23 has an upper surface 230 and an opposing lower surface 231, wherein the lower surface 231 is attached to the active surface 220 of the second chip 22 in a manner as not to interfere with arrangement of the bond pads 222 on the second chip 22. As the second chip 22 is in partial contact with the first chip 21, the supporting element 23 is dimensioned to cover a suspended portion 223 of the second chip 22 where no support is provided by the first chip 21. The characteristic feature of the invention is therefore the provision of the supporting element 23, which is used to enhance structural strength for the second chip 22, for the purpose of preventing the second chip 22 from cracking in a wire bonding process.

The first bonding wires 24 interconnects the bond pads 212 on the first chip 21 and the chip carrier 20, so as to establish electrical connection between the first chip 21 and the chip carrier 20. Similarly, the second chip 22 is electrically connected to the chip carrier 20 by bonding the second bonding wires 25 to the bond pads 222 on the second chip 22 and the chip carrier 20, respectively. The first and second bonding wires 24, 25 are gold wires. Since the wire bonding process employs conventional technology, it is not further described herein.

The encapsulant 26 formed on the chip carrier 20 is made of an encapsulating compound such as epoxy resin, and is used to encapsulate the first chip 21, the second chip 22, the supporting element 23, the first bonding wires 24 and the second bonding wires 25. This allows internal components of the semiconductor package 2 to be hermetically enclosed and protected against external moisture or contaminants by the encapsulant 26.

Figure 7:
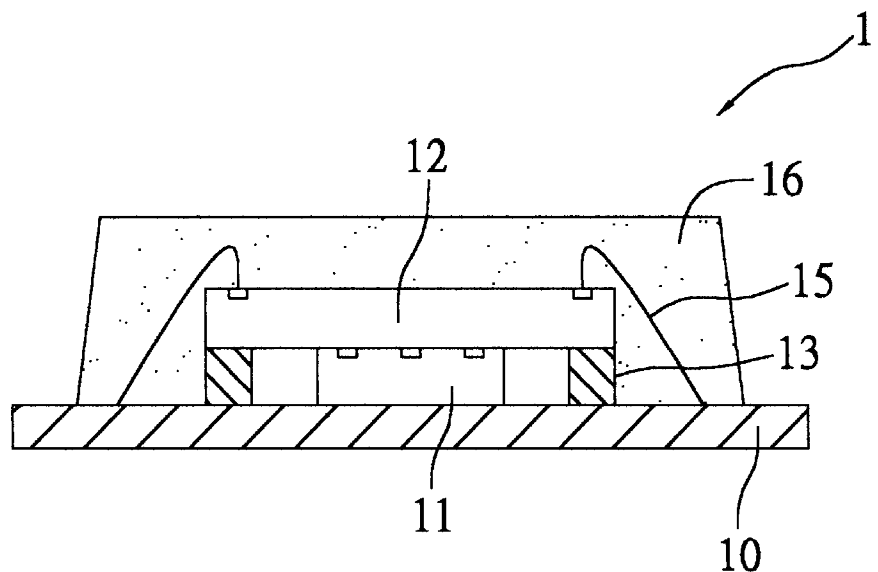
FIG. 7 (PRIOR ART) is a sectional view of a conventional semiconductor package.
Figure 8:
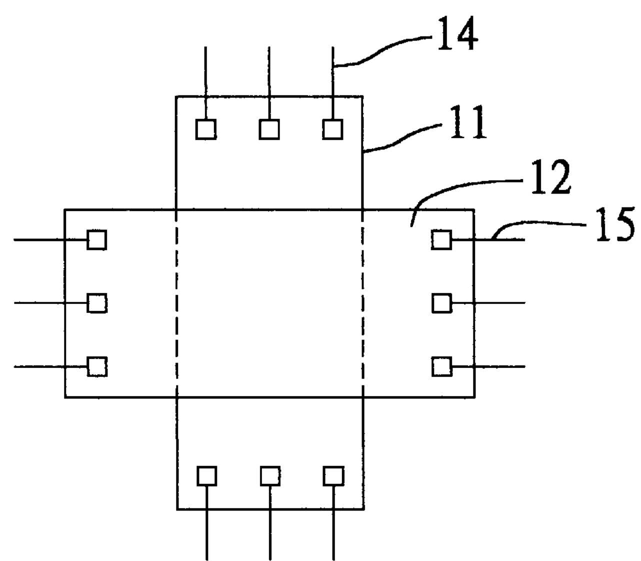
FIG. 8 (PRIOR ART) is a top view showing arrangement of stacked chips of FIG. 7.

Since the supporting element 23 covers the suspended portion 223 of the second chip 22, bending moment of the second chip 22 can be increased. During connecting the second bonding wires 25 to the second chip 22, the increased chip bending moment is capable of providing enhanced structural strength and thus preventing the occurrence of cracks of the second chip 22, so that the wire bonding quality can be assured. Moreover, unlike the supporting structure of pillars 13 used in the prior art as shown in FIG. 7, in the forming of the encapsulant 26, the supporting element 23 of the invention does not interfere with mold flow of the encapsulating compound, and thus no turbulence or void occurs in the mold flow, thereby not leading to popcorn effect that may cause serious damage in structure. Furthermore, the deposition of the supporting element 23 on the second chip 22 does not undesirably affect the chip planarity; therefore, the drawback in the prior art (as shown in FIG. 7) of unstable disposition of the second chip 12 due to bad coplanarity between the pillars 13 and the first chip 11 can be eliminated. In addition, the supporting element 23 can be formed as a plate that is made of a thermally conductive material such as copper or copper alloy (but not limited to this), which therefore can be cost-effectively fabricated by using simple processes. In conclusion, the semiconductor package 2 with the supporting element 23 can be made with assurance in quality, and also has advantages of process simplification and cost reduction in fabrication.

Second Preferred Embodiment

Figure 3:
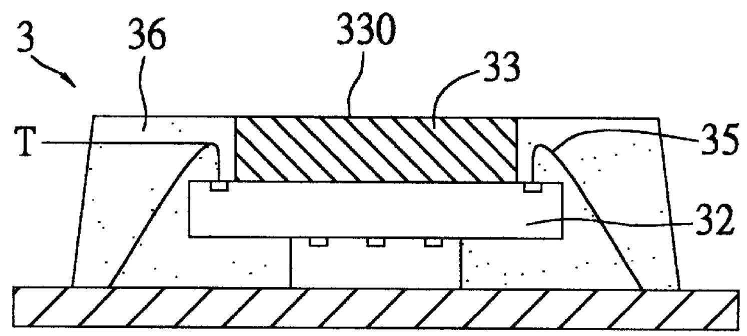
FIG. 3 is a sectional view of a semiconductor package of a second preferred embodiment of the invention.

FIG. 3 illustrates a semiconductor package 3 of a second preferred embodiment of the invention. As shown in the drawing, the semiconductor package 3 is structurally identical to that of the first embodiment, with the only difference in increasing the thickness of a supporting element 33 of the semiconductor package 3. The supporting element 33 is dimensioned to have its upper surface 330 higher in elevation than wire loop tops T of bonding wires 35 that are connected to a second chip 32, allowing the upper surface 330 to be exposed to outside of an encapsulant 36 used for chip encapsulation. Therefore, the supporting element 33 with increased thickness further enhances bending moment of the second chip 32, and thereby effectively prevents chip cracking from occurrence. As the supporting element 33 is made of a thermally conductive material such as copper or copper alloy, the exposed upper surface 330 helps improve heat dissipating efficiency of the semiconductor package 3.

Third Preferred Embodiment

Figure 4:
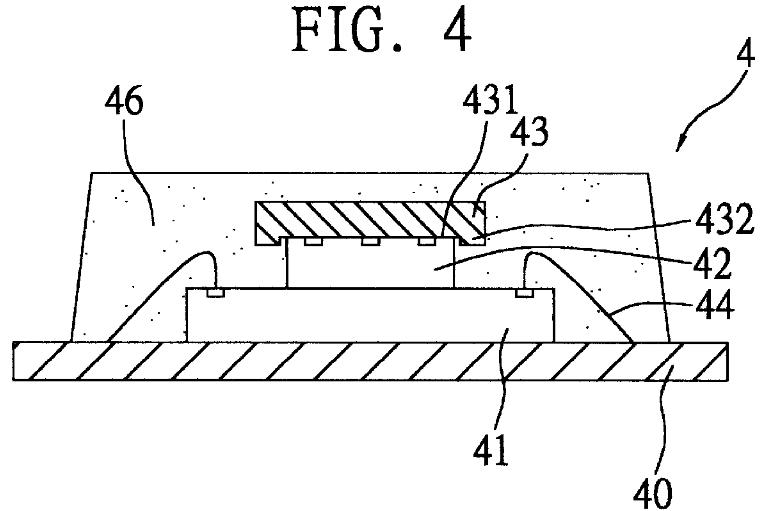
FIG. 4 is a sectional view of a semiconductor package of a third preferred embodiment of the invention.
Figure 5:
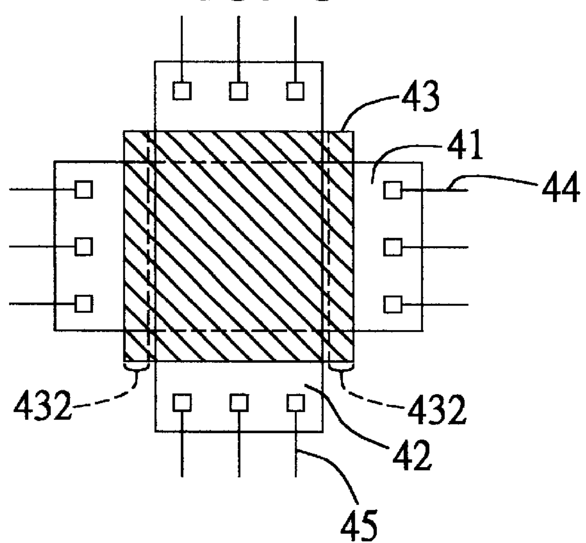
FIG. 5 is a top view showing arrangement of stacked chips and a supporting element of FIG. 4.

FIGS. 4 and 5 illustrate a semiconductor package 4 of a third preferred embodiment of the invention. As shown in the drawing, the semiconductor package 4 has a chip carrier 40 on which a first chip 41 and a second chip 42 are mounted in a stack manner, whereas the chips 41, 42 are electrically connected to the chip carrier 40 by bonding wires 44, 45, respectively. A supporting element 43 is deposited on the stacked chips 41, 42, and is dimensionally sufficient to form at least one protruding portion 432 on its lower surface 43 in a manner that, the protruding portion 432 is positioned outside edge sides of the second chip 42, and does not interfere with the connection between the second chip 42 and the bonding wires 45. That is, as shown in FIG. 5, the supporting element 43 needs to extend out of the edge sides of the second chip 42, and can be bent or extended downwardly to form the protruding portion 432. Finally, an encapsulant 46 is formed to encapsulate the chips 41, 42 and the supporting element 43. The protruding portion 432 of the supporting element 43 is capable of increasing structural strength of the supporting element 43, thereby allowing bending moment of the second chip 42 to be further enhanced. This therefore desirably helps maintain the second chip 42 intact in structure to be free of cracks in the wire bonding process, so that the wire bonding quality can be assured.

Fourth Preferred Embodiment

Figure 6:
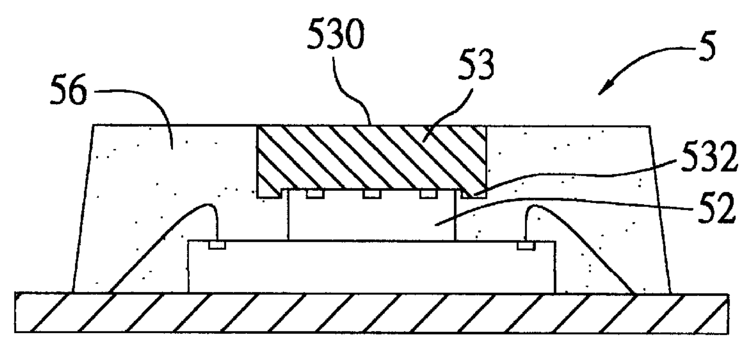
FIG. 6 is a sectional view of a semiconductor package of a fourth preferred embodiment of the invention.

FIG. 6 illustrates a semiconductor package 5 of a fourth preferred embodiment of the invention. As shown in the drawing, the semiconductor package 5 is structurally identical to that of the third embodiment, with the only difference in increasing the thickness of a supporting element 53 of the semiconductor package 5. The supporting element 53 is dimensioned to have its upper surface 530 higher in elevation than wire loop tops of bonding wires (not shown) that are connected to a second chip 52, allowing the upper surface 530 to be exposed to outside of an encapsulant 56 used for chip encapsulation. Such a supporting element 53 is therefore simultaneously provided with increase in thickness thereof and at least one protruding portion 532. Due to combined effect of the thickness increase and the protruding portion 532, structural strength of the supporting element 53 as well as bending moment of the second chip 52 can both be significantly enhanced, thereby making the second chip 52 sufficiently strong in structure without generating any chip crack in the wire bonding process. As the supporting element 53 is made of a thermally conductive material such as copper or copper alloy, the exposed upper surface 530 helps improve heat dissipating efficiency of the semiconductor package 5.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with stacked chips, comprising:

a chip carrier;

at least one first chip having an active surface and an opposing non-active surface, wherein the active surface are formed with a plurality of bond pads thereon, and the non-active surface is attached to the chip carrier;

at least one second chip having an active surface and an opposing non-active surface, wherein the active surface are formed with a plurality of bond pads thereon, and the non-active surface is partly attached to the active surface of the first chip in a stagger manner that the bond pads on the first chip are free from being covered by the second chip;

a supporting element having an upper surface and an opposing lower surface, wherein the lower surface is attached to the active surface of the second chip in a manner free of interference with arrangement of the bond pads on the second chip, and the supporting element is dimensionally sufficient in surface area to cover suspended part of the second chip, with the suspended part being free of contact with the first chip;

a plurality of first bonding wires for electrically connecting the bond pads on the first chip to the chip carrier;

a plurality of second bonding wires for electrically connecting the bond pads on the second chip to the chip carrier; and an encapsulant for encapsulating the first and second chips, the supporting element, and the first and second bonding wires.

2. The semiconductor package of claim 1, wherein the second chip is stacked on the first chip in a perpendicular stagger manner.

3. The semiconductor package of claim 1, wherein the supporting element is made of a thermally conductive material.

4. The semiconductor package of claim 3, wherein the thermally conductive material is a material selected from a group consisting of copper and copper alloy.

5. The semiconductor package of claim 1, wherein the supporting element has an upper surface thereof to be higher in elevation than wire loop tops of the second bonding wires.

6. The semiconductor package of claim 5, wherein the upper surface of the supporting element is exposed to outside of the encapsulant.

7. The semiconductor package of claim 1, wherein the first and second bonding wires are gold wires.

8. The semiconductor package of claim 1, wherein the encapsulant is made of a resin compound.

9. A semiconductor package with stacked chips, comprising:

a chip carrier;

at least one first chip having an active surface and an opposing non-active surface, wherein the active surface are formed with a plurality of bond pads thereon, and the non-active surface is attached to the chip carrier;

at least one second chip having an active surface and an opposing non-active surface, wherein the active surface are formed with a plurality of bond pads thereon, and the non-active surface is partly attached to the active surface of the first chip in a stagger manner that the bond pads on the first chip are free of being covered by the second chip;

a supporting element having an upper surface and an opposing lower surface, wherein the lower surface is attached to the active surface of the second chip in a manner free of interference with arrangement of the bond pads on the second chip, and the supporting element is dimensionally sufficient in surface area to cover suspended part of the second chip with the suspended part being free of contact with the first chip, and to form at least one protruding portion on a lower surface thereof, allowing the protruding portion to extend downwardly and to be positioned outside edge sides of the second chip;

a plurality of first bonding wires for electrically connecting the bond pads on the first chip to the chip carrier;

a plurality of second bonding wires for electrically connecting the bond pads on the second chip to the chip carrier; and an encapsulant for encapsulating the first and second chips, the supporting element, and the first and second bonding wires.

10. The semiconductor package of claim 9, wherein the second chip is stacked on the first chip in a perpendicular stagger manner.

11. The semiconductor package of claim 9, wherein the supporting element is made of a thermally conductive material.

12. The semiconductor package of claim 11, wherein the thermally conductive material is a material selected from a group consisting of copper and copper alloy.

13. The semiconductor package of claim 9, wherein the protruding portion of the supporting element is free of interference with connection between the bond pads on the first chip and the first bonding wires.

14. The semiconductor package of claim 9, wherein the supporting element has an upper surface thereof to be higher in elevation than wire loop tops of the second bonding wires.

15. The semiconductor package of claim 14, wherein the upper surface of the supporting element is exposed to outside of the encapsulant.

16. The semiconductor package of claim 9, wherein the first and second bonding wires are gold wires.

17. The semiconductor package of claim 9, wherein the encapsulant is made of a resin compound.

* * * * *